United States Patent
Refai-Ahmed et al.

(10) Patent No.: US 11,488,936 B2
(45) Date of Patent: Nov. 1, 2022

(54) STACKED SILICON PACKAGE ASSEMBLY HAVING VERTICAL THERMAL MANAGEMENT

(71) Applicant: Xilinx, Inc., San Jose, CA (US)

(72) Inventors: Gamal Refai-Ahmed, Santa Clara, CA (US); Suresh Ramalingam, Fremont, CA (US); Jaspreet Singh Gandhi, San Jose, CA (US); Cheang-Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/718,868

(22) Filed: Dec. 18, 2019

(65) Prior Publication Data

US 2021/0193620 A1 Jun. 24, 2021

(51) Int. Cl.
| | | |
|---|---|---|
| H01L 25/065 | (2006.01) | |
| H01L 23/367 | (2006.01) | |
| H01L 23/04 | (2006.01) | |
| H01L 23/31 | (2006.01) | |

(52) U.S. Cl.
CPC .......... *H01L 25/0657* (2013.01); *H01L 23/04* (2013.01); *H01L 23/3128* (2013.01); *H01L 23/367* (2013.01); *H01L 2225/0652* (2013.01); *H01L 2225/06513* (2013.01); *H01L 2225/06517* (2013.01); *H01L 2225/06548* (2013.01); *H01L 2225/06589* (2013.01)

(58) Field of Classification Search
CPC ............. H01L 25/0657; H01L 23/3128; H01L 2225/06548
See application file for complete search history.

(56) References Cited

U.S. PATENT DOCUMENTS

| | | | | |
|---|---|---|---|---|
| 2005/0167798 | A1* | 8/2005 | Doan ................ | H01L 25/0657 257/E21.705 |
| 2016/0141270 | A1* | 5/2016 | Koopmans .......... | H01L 25/0652 257/690 |
| 2019/0027444 | A1* | 1/2019 | Awujoola ............ | H01L 25/0657 |

OTHER PUBLICATIONS

Specification and drawings for U.S. Appl. No. 16/147,286, filed Sep. 28, 2018, entitled "Stacked Silicon Package Assembly Having Thermal Management".

* cited by examiner

*Primary Examiner* — Dale E Page
*Assistant Examiner* — Wilner Jean Baptiste
(74) *Attorney, Agent, or Firm* — Patterson + Sheridan, LLP

(57) ABSTRACT

A chip package assembly and method for fabricating the same are provided which utilize a plurality of electrically floating extra-die heat transfer posts for improved thermal management. In one example, a chip package assembly is provided that includes a substrate, a first integrated circuit (IC) die, and a first plurality of electrically floating extra-die conductive posts. The substrate has a first surface and an opposing second surface. The first integrated circuit (IC) die has a first surface and an opposing second surface. The second surface of the first IC die is mounted to the first surface of the substrate. The first plurality of electrically floating extra-die conductive posts extend from the first surface of the first IC die to provide a heat transfer path away from the first IC die.

20 Claims, 6 Drawing Sheets

STACKED SILICON PACKAGE ASSEMBLY HAVING VERTICAL THERMAL MANAGEMENT

TECHNICAL FIELD

Embodiments of the present invention generally relate to a chip package assembly, and in particular, to a chip package assembly comprising at least one integrated circuit (IC) die disposed on a package substrate or interposer, and a plurality of extra-die heat transfer posts extending from an upper surface of the IC die.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices.

In many chip package assemblies, providing adequate thermal management has become increasingly challenging. Failure to provide adequate cooling often results in diminished service life and even device failure. Thermal management is particularly problematic in applications where multiple dies are vertically stacked on a substrate in a single package assembly. In such applications, the IC dies that are located closer to the substrate often have poor heat transfer paths out of the package assembly. The lack of efficient paths to remove heat from these middle and lower positioned IC dies of the vertical IC stack often causes these dies to operate at temperatures very close to the thermal junction temperature limit. Thus, small fluctuations in ambient temperatures, such as by air conditioner failure, may quickly lead to the thermal junction temperature limit being exceeded, resulting in device failure or system shutdowns.

Therefore, a need exists for a chip package assembly having improved thermal management.

SUMMARY

A chip package assembly and method for fabricating the same are provided which utilize a plurality of electrically floating extra-die heat transfer posts for improved thermal management. In one example, a chip package assembly is provided that includes a substrate, a first integrated circuit (IC) die, and a first plurality of electrically floating extra-die conductive posts. The substrate has a first surface and an opposing second surface. The first integrated circuit (IC) die has a first surface and an opposing second surface. The second surface of the first IC die is mounted to the first surface of the substrate. The first plurality of electrically floating extra-die conductive posts extend from the first surface of the first IC die to provide a heat transfer path away from the first IC die.

In another example, a chip package assembly is provided that includes a substrate, first and second integrated circuit (IC) dies, first and second pluralities of electrically floating extra-die conductive posts, and a cover. The substrate has a first surface and an opposing second surface. The first IC die has a first surface and an opposing second surface. The second surface of the first IC is mounted to the first surface of the substrate. Each of the first plurality of extra-die conductive posts have a first end contacting the first surface of the first IC die and extend to a second end. The second IC die also has a first surface and an opposing second surface. The second surface of the second IC is mounted above the first surface of the first IC die between the first plurality of extra-die conductive posts. Each of the second plurality of electrically floating extra-die conductive posts also have a first end contacting the first surface of the second IC die and extend to a second end. The cover has a surface facing the first surfaces of the first and second IC dies that is disposed adjacent the second ends of the first and second pluralities of extra-die conductive posts. The first and second pluralities of extra-die conductive posts provide a heat transfer path between the cover and the first surfaces of the first and second IC dies.

In another example, a method for fabricating chip package assembly is provided that includes mounting a first integrated circuit (IC) die to a substrate, the first IC die having a first plurality of electrically floating extra-die conductive posts extending from a side of the first IC die facing away from the substrate, and mounting a second IC die to the second IC die between the first plurality of extra-die conductive posts extending from the first IC die facing away from the substrate.

In another example, a chip package assembly is provided that includes a substrate, a first integrated circuit (IC) die, a first plurality of electrically floating extra-die conductive posts, and a conductive member. The substrate has a first surface and an opposing second surface. The first integrated circuit (IC) die has a first surface and an opposing second surface. The second surface of the first IC is mounted to the first surface of the substrate. The first surface of the first IC die has a recess formed along at least one edge. The first plurality of electrically floating extra-die conductive posts extend from the first surface of the first IC die to provide a heat transfer path away from the first IC die. The conductive member is disposed in the recess.

In another example, a chip package assembly is provided that includes a substrate, first and second integrated circuit (IC) dies, first and second pluralities of electrically floating extra-die conductive posts, and a conductive member. The substrate has a first surface and an opposing second surface. The first IC die has a first surface and an opposing second surface. The second surface of the first IC is mounted to the first surface of the substrate. Each of the first plurality of extra-die conductive posts have a first end contacting the first surface of the first IC die and extend to a second end. The second IC die also has a first surface and an opposing second surface. The first surface of the second IC has a recess along at least one edge. The second surface of the second IC is mounted above the first surface of the first IC die between the first plurality of extra-die conductive posts. Each of the second plurality of electrically floating extra-die conductive posts also have a first end contacting the first surface of the second IC die and extend to a second end. The conductive member is disposed in the recess.

In another example, a method for fabricating chip package assembly is provided that includes mounting a first integrated circuit (IC) die to a substrate, the first IC die having a first plurality of electrically floating extra-die conductive posts extending from a side of the first IC die facing away from the substrate, mounting a second IC die to the second IC die between the first plurality of extra-die conductive posts extending from the first IC die facing away from the substrate, the first surface of the second IC having a recess along at least one edge, and disposing a conductive member disposed in the recess.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided which utilize a plurality of electrically floating extra-die heat transfer posts that extend from an upper surface of one or more integrated circuit (IC) dies. The chip package assemblies described herein include at least one integrated circuit (IC) die disposed on a substrate. The substrate may be an interposer and/or a package substrate. The adjective "extra-die" describes that the posts are not connected to, and are electrically floating relative to, the functional circuitry (ground, power, data) of the IC die. The extra-die heat transfer posts provide robust heat transfer paths vertically from an upper surface of the IC die, thus improving the thermal management of the IC die and consequently, the chip package assembly. The use of extra-die heat transfer posts is particularly effective for removing heat from IC dies that are separated from a cover of the chip package assembly by one or more other IC dies. Advantageously, the extra-die heat transfer posts enhance heat transfer vertically from the interior of the chip package assembly, thus, improving the reliability and performance of the chip package assembly. Furthermore, the extra-die heat transfer posts may be arranged to enhance heat transfer across the entirety of the chip package assembly, for example by using more posts on one region relative to another, thus reducing hot spots which could induce warpage or provide insufficient temperature control of the IC dies. Additionally, the ability of the extra-die heat transfer posts to remove heat from IC dies positioned in the middle and bottom of a vertical stack of IC dies significantly reduces thermal coupling and temperature rise within the interior of chip packages assembly, which advantageously improves electromigration (EM) lifetime.

Figure 1:
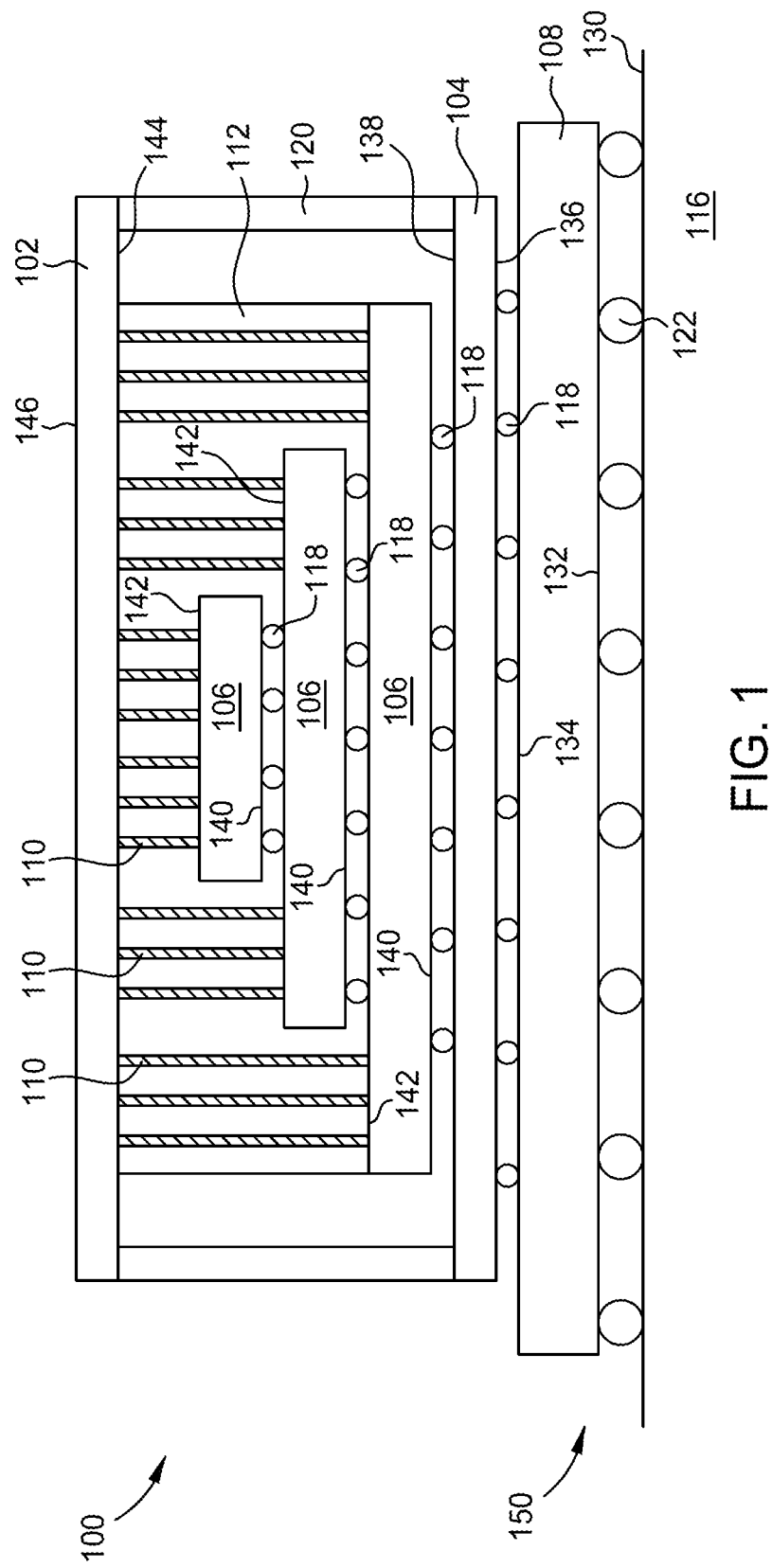
FIG. 1 is a schematic sectional view of a chip package assembly having a plurality of extra-die heat transfer posts extending from a top surface of an integrated circuit (IC) die.

Turning now to FIG. 1, a schematic sectional view of a chip package assembly 100 having a plurality of extra-die heat transfer posts 110 extending from a top surface 142 of one or more integrated circuit (IC) dies 106 is illustrated. The chip package assembly 100 also includes a cover 102, an interposer 104 and a package substrate 108. Although three IC dies 106 are shown in FIG. 1, the total number of IC dies may range from one to as many as can be fit within the chip package assembly 100.

The extra-die heat transfer posts 110 define the main portion of the heat transfer paths out of the chip package assembly 100. The use of extra-die heat transfer posts 110 is particularly advantageous in configurations where dies 106 closer to the cover 102 have a smaller projected area than an underlying die 106, thus allowing the extra-die heat transfer posts 110 to be in contact with the top surface 142 of the underlying die 106, which conventionally are at risk to operate at or near the maximum operating temperatures. Examples of IC dies 106 that may be utilized in the chip package assembly 100 include, but are not limited to, programmable logic devices, such as field programmable gate arrays (FPGA), memory devices, such as high bandwidth memory (HBM), optical devices, processors or other IC logic structures. One or more of the IC dies 106 may optionally include optical devices such as photo-detectors, lasers, optical sources, and the like.

Each IC die 106 includes a bottom surface 140 disposed opposite the top surface 142. The bottom and top surfaces 140, 142 do not necessarily represent the active and substrate sides of the dies 106. It is intended that the bottom surface 140 of one die 106 mounted to the top surface 142 of a second IC die 106 may result in the active sides of each die 106 facing the same direction, or facing opposite directions. For example, the active side of one die 106 may be directly mounted to the active side of the adjacent die 106.

The top surface 142 of the upper most IC die 106 faces the cover 102, while the bottom surface 140 of the upper most IC die 106 faces the top surface 142 of the lower most IC die 106. Contact pads exposed on the bottom surface 140 of the die 106 are coupled to contact pads exposed on the top surface 142 of the adjacent underlying IC die 106 by solder connections 118 or other suitable electrical connection.

The top surface 142 of the upper most IC die 106 is adjacent to the cover 102, while the bottom surface 140 of the lower most IC die 106 is adjacent to the interposer 104. The bottom surface 140 of the lower most die 106 is coupled to a top surface 138 of the interposer 104 by solder connections 118 or other suitable electrical connection. The top surface 142 of the upper most die 106 faces a bottom surface 144 of the cover 102. Thermal interface material (TIM) (not shown) may be disposed between the top surface 142 of the upper most IC die 106 (i.e., the die 106 closest the cover 102) and the bottom surface 144 of the cover 102 to enhance heat transfer therebetween. In one example, the TIM may be a thermal gel or thermal epoxy, such as, packaging component attach adhesives.

In some implementations, the cover 102 is fabricated from rigid material. In other implementations particularly where it is desirable to utilize the cover 102 to receive heat transmitted from the IC dies 106 through the posts 110, the cover 102 is fabricated from a thermally conductive material, such as stainless steel, copper, nickel-plated copper or aluminum, among other suitable materials. A heat sink, not shown, may optionally be mounted to a top surface 146 of the cover 102. Thus, the cover 102 with the extra-die heat transfer posts 110 are part of the heat transfer paths designed to more heat out of the chip package assembly 100.

The cover 102 may be structurally coupled to the package substrate 108 to increase the rigidity of the chip package assembly 100. Optionally, a stiffener 120 may be utilized to structurally couple the cover 102 to the package substrate 108. When used, the stiffener 120 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 120 can also be made of organic materials such as copper-clad laminate.

The functional circuitry of the IC dies 106 is connected to the circuitry of the interposer 104 through the solder connections 118. The circuitry of the interposer 104 is similarly connected to the circuitry of the package substrate 108. In the example depicted in FIG. 1, a bottom surface 136 of the interposer 104 is electrically and mechanically coupled to a top surface 134 of the package substrate 108 by solder connections 118 or other suitable connection.

The chip package assembly 100 may be mounted to a printed circuit board (PCB) 116 to form an electronic device 150. In this manner, the circuitry of the package substrate 108 is coupled to the circuitry of the package substrate 108 via solder balls 122, or other suitable connection. In the example depicted in FIG. 1, a bottom surface 132 of the package substrate 108 is electrically and mechanically coupled to a top surface 130 of the PCB by the solder balls 122.

Dielectric filler 112 is disposed on the interposer 104 at least laterally circumscribes the dies 106. The dielectric filler 112 may also encapsulate the dies 106 against the interposer 104. The dielectric filler 112 provides additional rigidity to the package assembly 100, while also protecting the solder connections 118 between the IC dies 106. The dielectric filler 112 may be an epoxy-based material or other suitable material. The dielectric filler 112 may additionally include fillers, for example, inorganic fillers such as silica ($SiO_2$). In one example, the dielectric filler 112 may have a CTE between about 20 to about 40 ppm/degree Celsius, a viscosity of between about 5 to about 20 Pascal-seconds, and a Young's modulus of between about 6 to about 15 Pascal (Pa).

In one example, the dielectric filler 112, prior to curing, has a viscosity suitable to flow into and fill the interstitial space between the bottom surface 140 of the dies 106 and the top surface 138 of the interposer 104 around the solder connections 118. Alternatively, a separate underfill material may be used to fill the interstitial space the bottom surface 140 of the dies 106 and the top surface 138 of the interposer 104 around the solder connections 118, while the dielectric filler 112 is disposed over the underfill and fills the interstitial space between adjacent dies 106.

The extra-die heat transfer posts 110 extend through the dielectric filler 112 and provide robust conductive heat transfer paths between the top surface 142 of at least one IC die 106 and the bottom surface 144 of the cover 102. TIM may be utilized between the posts 110 and the cover 102 to provide a robust heat transfer interface between the posts 110 and the bottom surface 144 of the cover 102.

The posts 110 generally are formed from thermally conductive material selected to provide good heat transfer between the cover 102 and the top surface 142 of the IC die 106. The thermally conductive material may be single solid mass, or comprised of multiple elements, such as powder, metal wool, or discrete shapes, among other forms. The thermally conductive material may be solder paste, metal fibers, metal powder, metal particles, metal balls, thermally conductive adhesive or other suitable thermally conductive material. In one example, thermally conductive material is a metal, such as copper, gold, silver, titanium or other suitable metal. In another example, the thermally conductive material is comprised of a plurality of copper balls that fill a hole formed in the dielectric filler 112 bounding the posts 110. In yet another, the thermally conductive material is comprised of a bulk metal plated or otherwise deposited on a seed layer. For example, the bulk metal may be copper plated on a copper or titanium seed layer. In still another, the interstitial space between the copper balls (or other conductive material filling the hole in the posts 110) may be filed TIM or other heat transfer material.

The posts 110 may have any suitable sectional profile, and generally have a length that is about the same as or longer than the height of the die 106. In one example, the sectional profile of the post 110 is circular. The number, size, density and location of the posts 110 may be selected to provide a desired heat transfer profile between the cover 102 and the interposer 104, for example, to compensate for one die 106 producing more heat than another die 106. Although not required, the posts 110 generally have axial an orientation that is perpendicular to a plane of the top surface 142 of the IC die 106.

The posts 110 generally have a length that is equal to or greater than a thickness of the IC die 106. Some posts may have a length that is equal to or greater than a sum of the thicknesses of the IC dies 106 overlying the surface 142 to which the post 110 is disposed.

Figure 2:
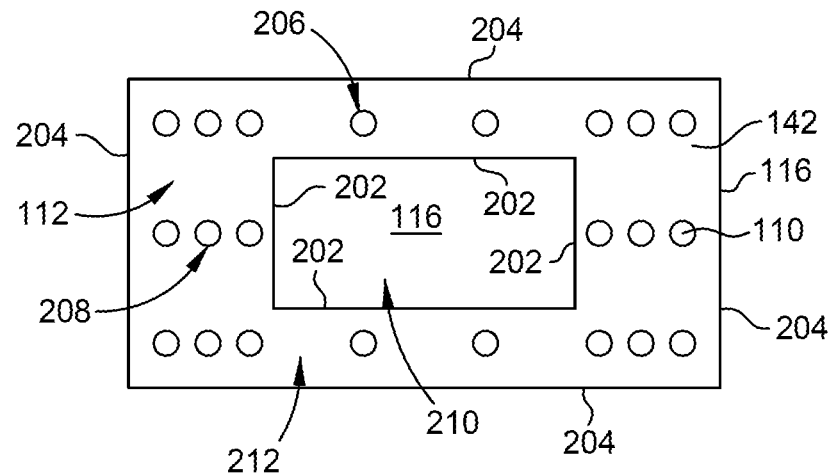
FIG. 2 is a partial schematic sectional view of the chip package assembly of FIG. 1 illustrating an exemplary geometric arrangement of the extra-die heat transfer posts extending from the top surface of one IC and outward of another IC die.

FIG. 2 is a partial schematic sectional view of the chip package assembly 100 of FIG. 1 illustrating an exemplary geometric arrangement of the extra-die heat transfer posts 110 extending through the dielectric filler 112 from the top surface 142 of one IC die 106 and outward of an overlying IC die 106. In the example depicted in FIG. 2, the IC die 106 identified by reference numeral 210 overlays, i.e., is closer to the cover 102, than the IC die 106 identified by reference numeral 212. Thus, a portion of the top surface 142 of the lower IC die 212 is exposed outward of the sides 202 of the overlying IC die 210. This exposed portion of the top surface 142 of the lower IC die 212 provides a surface to which the extra-die heat transfer posts 110 can contact, and thus, provide a thermally conductive heat transfer path upward from the lower IC die 212 to the cover 102 without interference of the overlying IC die 210.

In the example depicted in FIG. 2, the extra-die heat transfer posts 110 includes posts 206 that are disposed between adjacent short sides 202, 204 of the IC dies 210, 212. The number of posts 206 disposed between adjacent sides 202, 204 may be from one to as many as desired. The posts 206 are generally surrounded by the dielectric filler 112.

Optionally, in the alternative or additionally, the extra-die heat transfer posts 110 includes posts 208 that are disposed between adjacent short sides 202, 204 of the IC dies 210, 212. The number of posts 208 disposed between adjacent sides 202, 204 may be from one to as many as desired. The posts 208 are also generally surrounded by the dielectric filler 112.

The posts 206, 208 are generally in good thermal contact with the top surface 142 of the IC die 212. Good thermal contact may be maintained between the posts 206, 208 and the top surface 142 of the IC die 212 by disposing TIM or other good thermally conductive material between the posts 206, 208 and the top surface 142 of the IC die 212. Good thermal contact may also be maintained by depositing the posts 206, 208 directly on the top surface 142 of the IC die 212. For example, the posts 206, 208 may be plated on the top surface 142 of the IC die 212 through a hole formed in the dielectric filler 112. The hole may be formed in the dielectric filler 112 in any suitable manner, such as etching, laser drilling, drilling or other technique.

Described differently, the posts 206, 208 are disposed outward of one overlying the IC die 106 and inward of the outer edge of the dielectric filler 112 that faces the stiffener 120 (as shown in FIG. 1). The location, size and density of the posts 206, 208 may be selected to enhance heat transfer in desired locations, and to control the warpage of the chip package assembly 100.

Figure 3:
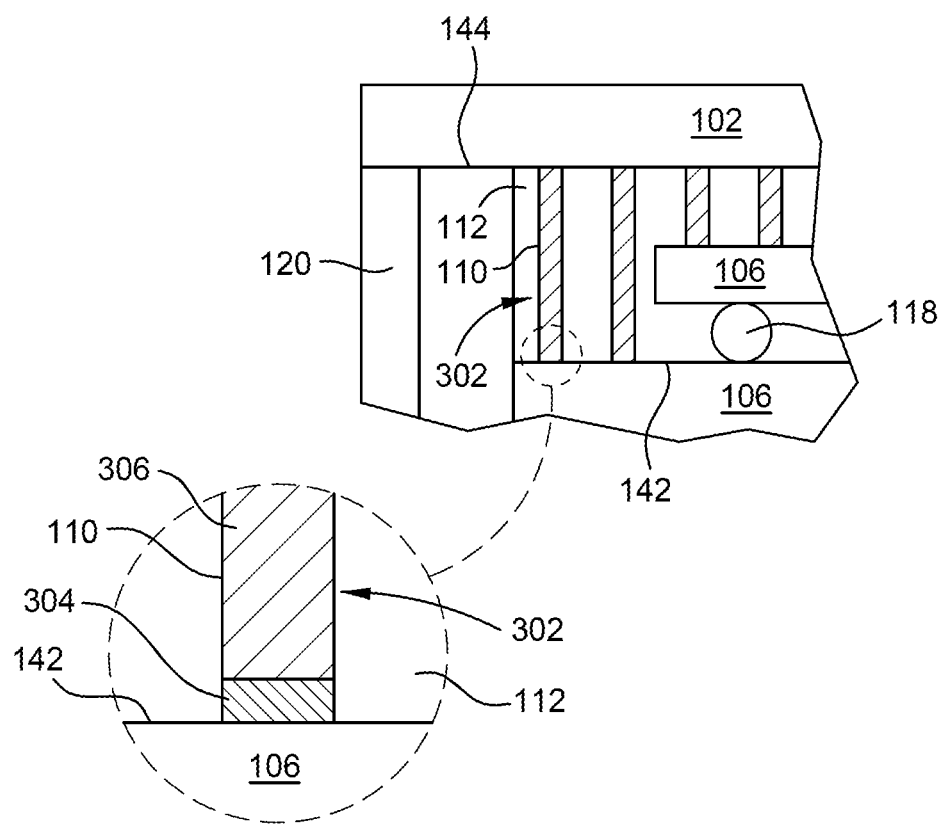
FIG. 3 is a schematic sectional view of another chip package assembly having a plurality of extra-die heat transfer posts extending from a top surface of an IC die.

FIG. 3 is a schematic partial sectional view of one example of the extra-die heat transfer post 110 disposed between the top surface 142 of the IC die 106 and the bottom surface 144 of the cover 102. The post 110 is disposed in a hole 302 extending through the dielectric filler 112. The hole 302 may be formed prior to depositing the post 110 in the dielectric filler 112. For example, the hole 302 may be formed by etching, laser drilling, embossing, thermoforming, mechanical drilling or other suitable method. The hole 302 may alternatively be formed after the post 110 is disposed on the top surface 142 of the IC die 106. For example, the dielectric filler 112 may be formed around the previously formed post 110, such as by molding the filler 112 around a previously formed post 110 or other suitable technique.

In the embodiment depicted in FIG. 3, the post 110 includes a bulk conductor 306 extending between the top surface 142 of the IC die 106 and the cover 102. The bulk conductor 306 may be a metal filling or plated within the hole 302. In one example, the bulk conductor 306 is electroless or electro-plated copper. The bulk conductor 306 may be formed directly on the top surface 138 of the interposer 104. Optionally, a seed layer 304 may be formed on the top surface 142 of the IC die 106, and the bulk conductor 306 formed by electroplating on the seed layer 304. Use of the seed layer 304 is not required for electroless plating of the bulk conductor 306 within the hole 302. Although not shown, the seed layer 304 may additionally be formed along the sidewalls of the hole 302.

Once the bulk conductor 306 is formed in the hole 302, TIM is disposed on the bulk conductor 306 to provide a good heat transfer interface between the post 110 and the cover 102 to advantageously improve the heat transfer performance of the chip package assembly 100. Optionally, TIM may be disposed in the hole 302 between the post 110 and the top surface 142 of the IC die 106 to provide a good heat transfer interface between the post 110 and the IC die 106.

Figure 4:
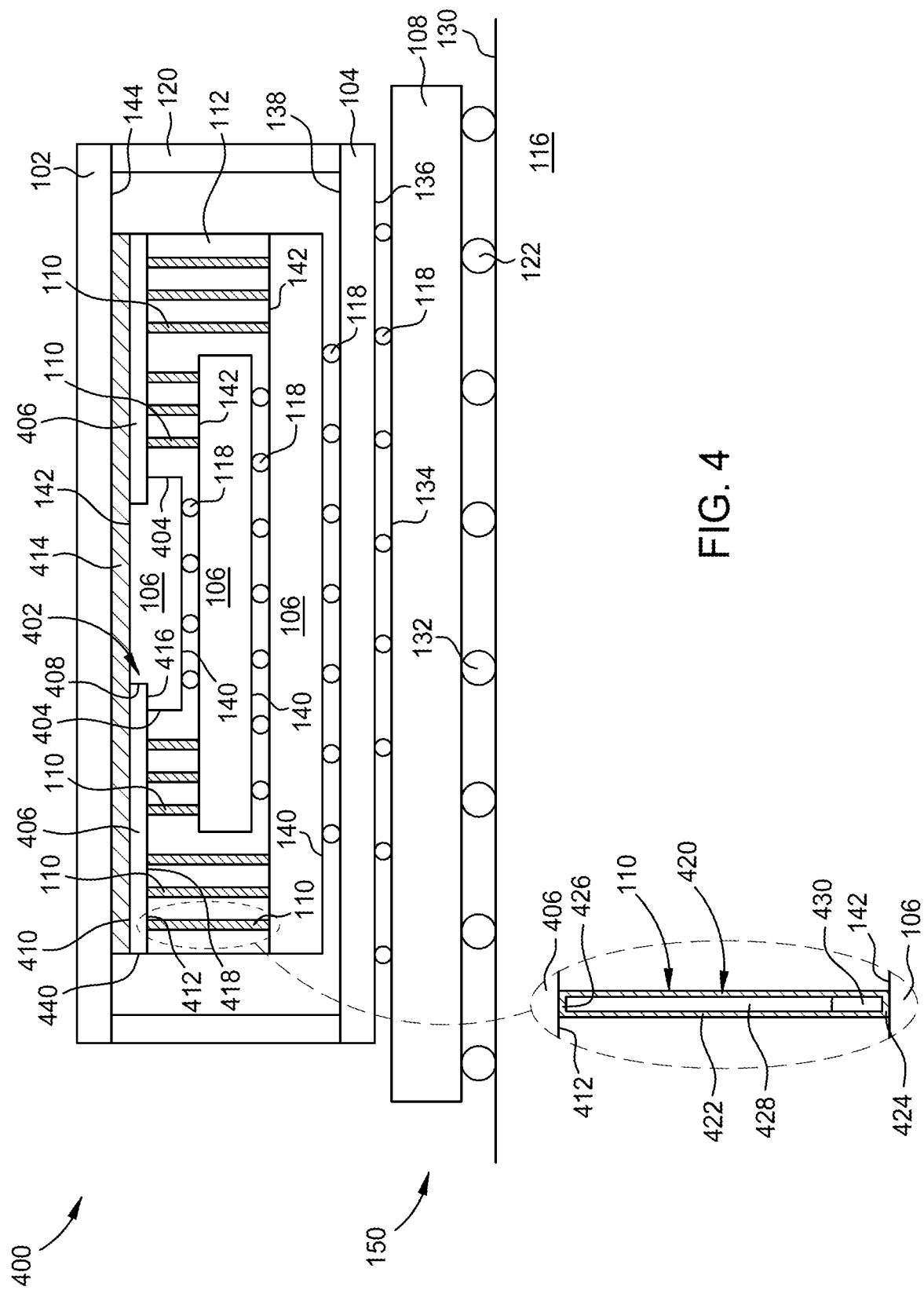
FIG. 4 a schematic sectional view of another chip package assembly having a plurality of extra-die heat transfer posts extending from a top surface of one or more IC dies.

FIG. 4 a schematic sectional view of another chip package assembly 400 having a plurality of extra-die heat transfer posts 110 extending from a top surface 142 of one or more integrated circuit (IC) dies 106. The chip package assembly 400 also includes a cover 102, an interposer 104 and a package substrate 108. The chip package assembly 400 is essentially the same as the chip package assembly 100 described above, except wherein the chip package assembly 400 also wherein a top surface 142 of the IC die 106 closest the cover 102 includes a recess 402 formed along at least one edge defined at the intersection of the side 404 and the top surface 142 of the IC die 106, which is configured to accept a conductive member 406 disposed in the recess 402. The conductive member 406 is connected to one or more of the extra-die conductive posts 110 extending upward from an underlying IC die 106, and is part of the heat transfer paths designed to more heat to the cover 102 and out of the chip package assembly 100.

In the example of FIG. 4, the conductive member 406 is a thermally conductive plate, foil, and other suitable thermally conductive structure. For example, the conductive member 406 may be a metal plate, such as a gold, silver, titanium or copper plate. The conductive member 406 has an inner edge 408 that overlaps the side 404 of the upper most IC die 106, i.e., the IC die closest the cover 102. The conductive member 406 may extend from the inner edge 408 to an outer edge 440 to extend over the top surfaces 142 of at least two or more IC dies 106.

In one example, the conductive member 406 has a ring shape. When having a ring shape, the inner edge 408 of the conductive member 406 is overlaps all four sides 404 of the upper most IC die 106. Stated differently, the inner edge 408 of the conductive member 406 resides in the portions of the recess 402 formed in each of the four sides 404 of the upper most IC die 106. Alternatively, the inner edge 408 of the conductive member 406 may reside in the recess 402 in only one, two or three sides 404 of the upper most IC die 106.

The conductive member 406 includes a top surface 410 and a bottom surface 412. The top surface 410 of the conductive member 406 faces the cover 102. In the example depicted in FIG. 4, TIM 414 is disposed between the top surface 410 of the conductive member 406 and the cover 102 to enhance heat transfer therebetween. An inner portion 416 of the bottom surface 412 of the conductive member 406 is in contact with the recess 402 formed in the IC die 106. An outer portion 418 of the bottom surface 412 of the conductive member 406 is in contact with the dielectric filler 112 and the upper ends of the extra-die posts 110.

The outer edge 440 of the conductive member 406 is disposed outward of the side 404 of the upper most IC die 106 and extend to or at least close to a position laterally above the side 404 of the IC die 106 disposed directly below the upper most IC die 106. When two or more IC dies 106 are disposed below the upper most IC die 106, the outer edge 432 of the conductive member 406 is disposed outward, i.e., extends beyond, of the side 404 of at least the IC die 106 directly below the upper most IC die 106.

The extra-die posts 110 may be fabricated as described above or by another suitable technique. The extra-die posts 110 may be disposed in contact with the conductive member 406 on all sides 404 of the upper most IC die 106. Alternatively the extra-die posts 110 may be disposed in contact with the conductive member 406 on at least one pair of opposing sides 404 of the upper most IC die 106. In yet another example, the extra-die posts 110 may be disposed in contact with the conductive member 406 on at least one or three sides 404 of the upper most IC die 106. Generally, the extra-die posts 110 are laterally surrounded by the dielectric filler 112.

Similar to the chip package assembly 100 described above, the extra-die posts 110 are disposed in holes 302 extending through the dielectric filler 112. The extra-die post 110 may be disposed in the hole 302 directly in contact with the top surface 142 of one or more, or even all of the IC dies 106 underlying the upper most IC die 106. Optionally, powder, metal wool, discrete metal shapes, solder paste, metal fibers, metal powder, metal particles, metal balls, and thermally conductive adhesive, may be disposed between the post 110 and the top surface 142 of the IC die 106 underlying the upper most IC die 106.

Alternatively, one or more of the extra-die posts 110 utilized on the chip package assemblies 100, 400 is in the form of an object configured to provide a high rate of heat transfer rate between ends of the object. The high heat transfer rate object uses super thermal conductive properties to move heat between the ends of the object. The high heat transfer rate object can include either (1) vibrating and contacting particles within the object to transfer the heat, such as industrial diamonds, or (2) moving particles within the object by providing two passive flows functionality, such as heat pipes, or (3) moving particles with forced flow movement by introduced fluid circulation within the object which will pumped from external object (i.e. pump outside the package). In the example depicted in FIG. 4, one or more of the one or more of the extra-die posts 110 is configured as a high heat transfer rate object in the form of a heat pipe 420. The heat pipe 420 includes a sealed tube 422 having a first end 424 and a second end 426. The tube 422 includes a sealed cavity 428 in which a phase change material 430 is disposed. In operation, the phase change material 430 in a liquid phase in contact with a thermally conductive solid surface, i.e., the first end 424 of the tube 422, turns into a vapor by absorbing heat from the top surface 142 of one of the underlying dies 106. The vapor (e.g., the phase change material 430) then travels between the first end 424 of the tube 422 inside the cavity 428 to the cold interface, i.e., the second end 426 of the tube 422, and condenses back into a liquid—releasing the latent heat into the cover 102 through the TIM, as shown in FIG. 1, or releasing the latent heat into the conductive member 406 and eventually to the cover 102 through the TIM 414, as shown in FIG. 4. The phase change material 430 in liquid form then returns to the hot interface at the first end 424 of the tube 422 through capillary action and/or gravity, and the cycle repeats. Due to the very high heat transfer coefficients for boiling and condensation, the extra-die post 110 highly effectively and efficiently conducts heat between between the top surface 142 of the underlying die 106 and the bottom surface 144 of the cover 102 to advantageously improve the heat transfer performance of the chip package assemblies 100, 400.

Figure 5:
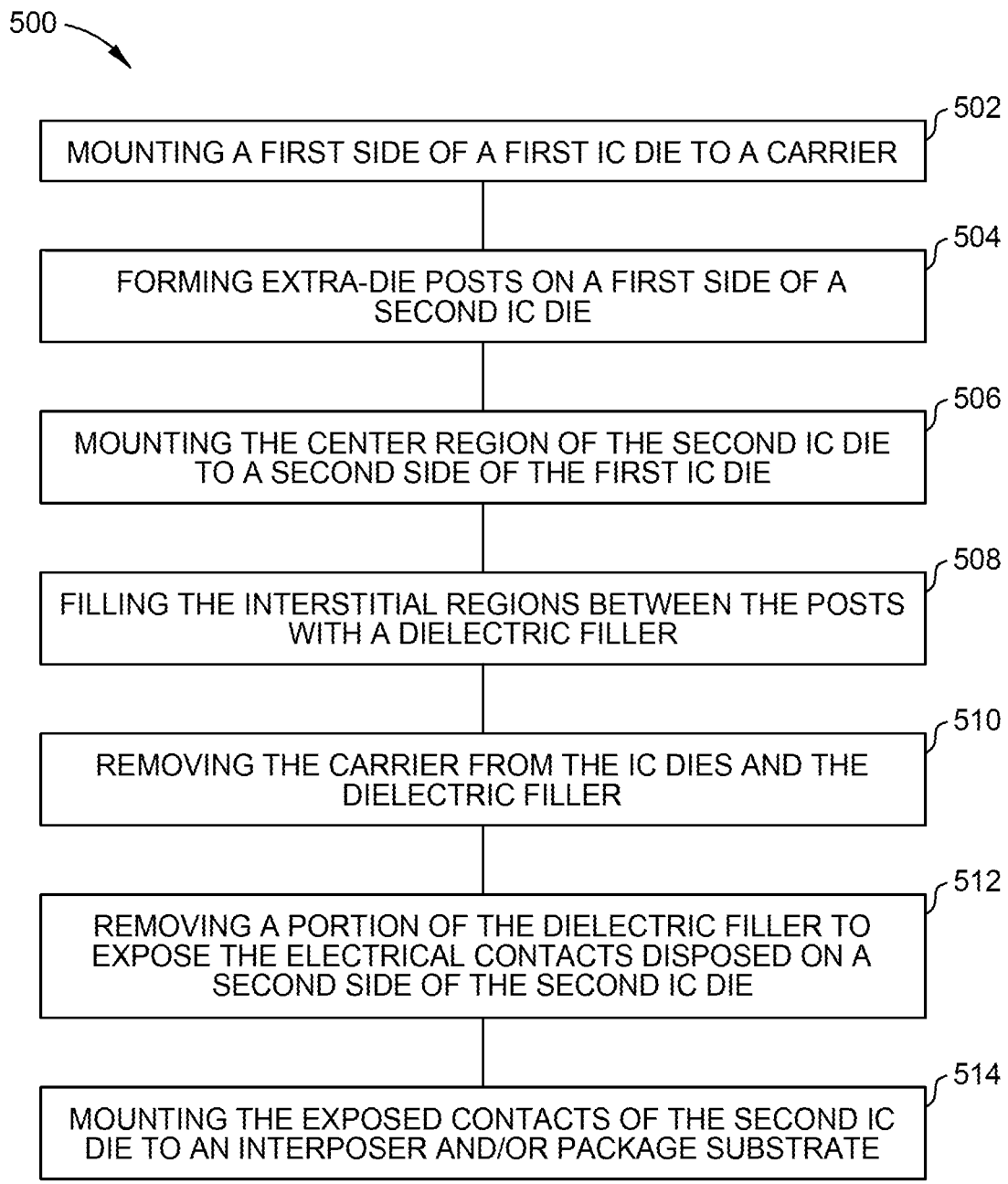
FIGS. 5-7 are flow diagrams of various methods for fabricating a chip package assembly having extra-die heat transfer posts.

FIG. 5 is a flow diagram of a method 500 for fabricating a chip package assembly, such as but not limited to the chip package assemblies 100, 400 described above. The method 500 begins at operation 502 by mounting a first side of a first IC die to a carrier. The carrier is utilized only during the initial fabrication operations, and as such is removably attached to the top surface 142 of the die 106. In one example, the top surface 142 of the upper most die 106 is attached to the carrier using releasable pressure sensitive adhesive.

At operation 504, extra-die posts are formed on a first side of a second IC die. The extra-die posts are generally formed in an arrangement leaving a center region of the first IC die of second IC die free from the posts. In one example, the extra-die posts include a bulk layer deposited over a seed layer. The seed layer may be deposited using chemical vaper deposition, physical vapor deposition, inkjet printing or other suitable technique. The seed layer provides an adhesion layer for metal materials (e.g., bulk layer) subsequently deposited on the seed layer. In one example, the seed and bulk layers are fabricated from copper. The bulk conductor may be deposited on the seed layer using electroless plating, electro-plating, chemical vaper deposition, physical vapor deposition, or other suitable technique.

Alternatively, operation 504 may be accomplished by disposing a thermally conductive material on the first side of the second IC die. For example, thermally conductive material in the form of a high heat transfer rate object, heat pipe, TIM, or other thermally conductive adhesive or paste may be utilized to form the conductive post.

At operation 506, the center region of the second IC die is mounted to a second side of the first IC die. In one example, an active side of the second IC die is mounted to an active side of the first IC die. In another example, the active side of the second IC die is mounted to the substrate side (e.g., silicon side) of the first IC die. At operation 506, solder connections are reflowed between the first and second IC dies, electrically and mechanically connecting the circuitry of first IC die to the circuitry of the second IC die.

At operation 508, the interstitial regions between the posts are filled with a dielectric filler. As discussed above, the dielectric filler protects the solder connections between adjacent dies. The dielectric filler also increases the structural rigidity of the chip package assembly. The dielectric filler may be spin on, dispensed, over molded or deposited by another suitable method.

At operation 510, the carrier is removed from the IC dies and the dielectric filler. At operation 512, a portion of the dielectric filler is removed to expose the electrical contacts disposed on a second side of the second IC die. In one example, the dielectric filler is removed to expose the electrical contacts by grinding or other suitable technique. Operation 510 may occur prior to operation 512, or vice versa.

At operation 514, the exposed contacts of the second IC die are mounted to an interposer and/or package substrate. At operation 514, solder connections are reflowed between the second IC die and the interposer, electrically and mechanically connecting the circuitry of second IC die to the circuitry of the interposer.

Figure 6:
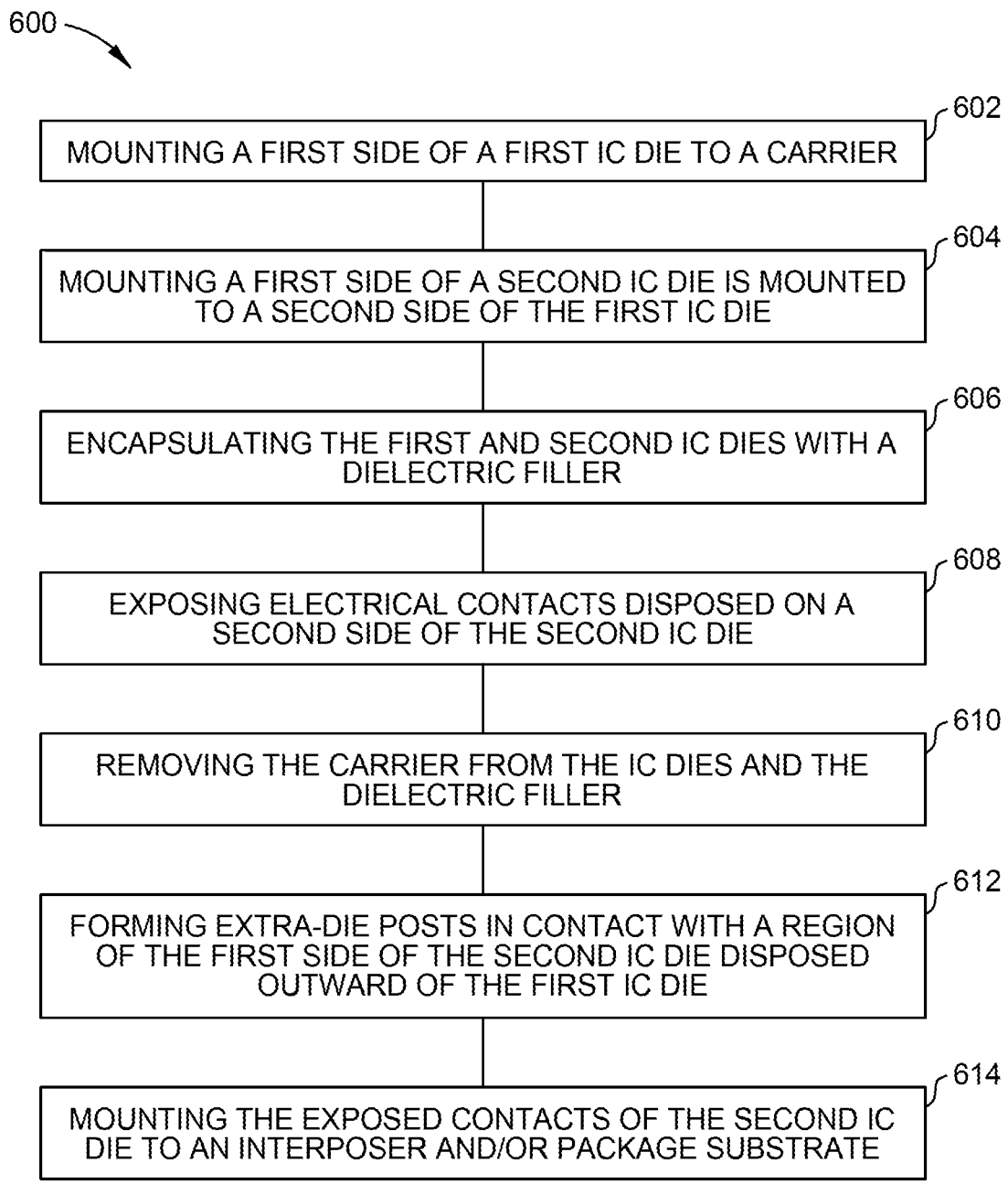

FIG. 6 is a flow diagram of a method 600 for fabricating a chip package assembly, such as but not limited to the chip package assemblies 100, 400 described above. The method 600 begins at operation 602 by mounting a first side of a first IC die to a carrier.

At operation 604, a first side of a second IC die is mounted to a second side of the first IC die. The second IC die extends outward beyond the sides of the first IC die. In one example, an active side of the second IC die is mounted to an active side of the first IC die. In another example, the active side of the second IC die is mounted to the substrate side (e.g., silicon side) of the first IC die. At operation 604, solder connections are reflowed between the first and second IC dies, electrically and mechanically connecting the circuitry of first IC die to the circuitry of the second IC die.

At operation 606, the first and second IC dies are encapsulated with a dielectric filler. At operation 608, electrical contacts disposed on a second side of the second IC die are exposed. In one example, a portion of the dielectric filler is removed to expose the electrical contacts disposed on the second side of the second IC die. In one example, the dielectric filler is removed to expose the electrical contacts by grinding or other suitable technique. At operation 610, the carrier is removed from the IC dies and the dielectric filler.

At operation 612, extra-die posts are formed in contact with a region of the first side of the second IC die disposed outward of the first IC die. In one example, the extra-die posts are formed in holes disposed through the dielectric filler. During operation 612, the holes may be formed through the dielectric filler by etching, mechanically drilling, laser drilling or other suitable technique. The extra-die posts may be formed by plating, or disposing a high heat transfer rate object, TIM, or other thermally conductive adhesive or paste in the holes.

At operation 614, the exposed contacts of the second IC die are mounted to an interposer and/or package substrate. At operation 614, solder connections are reflowed between the second IC die and the interposer, electrically and mechanically connecting the circuitry of second IC die to the circuitry of the interposer.

Figure 7:
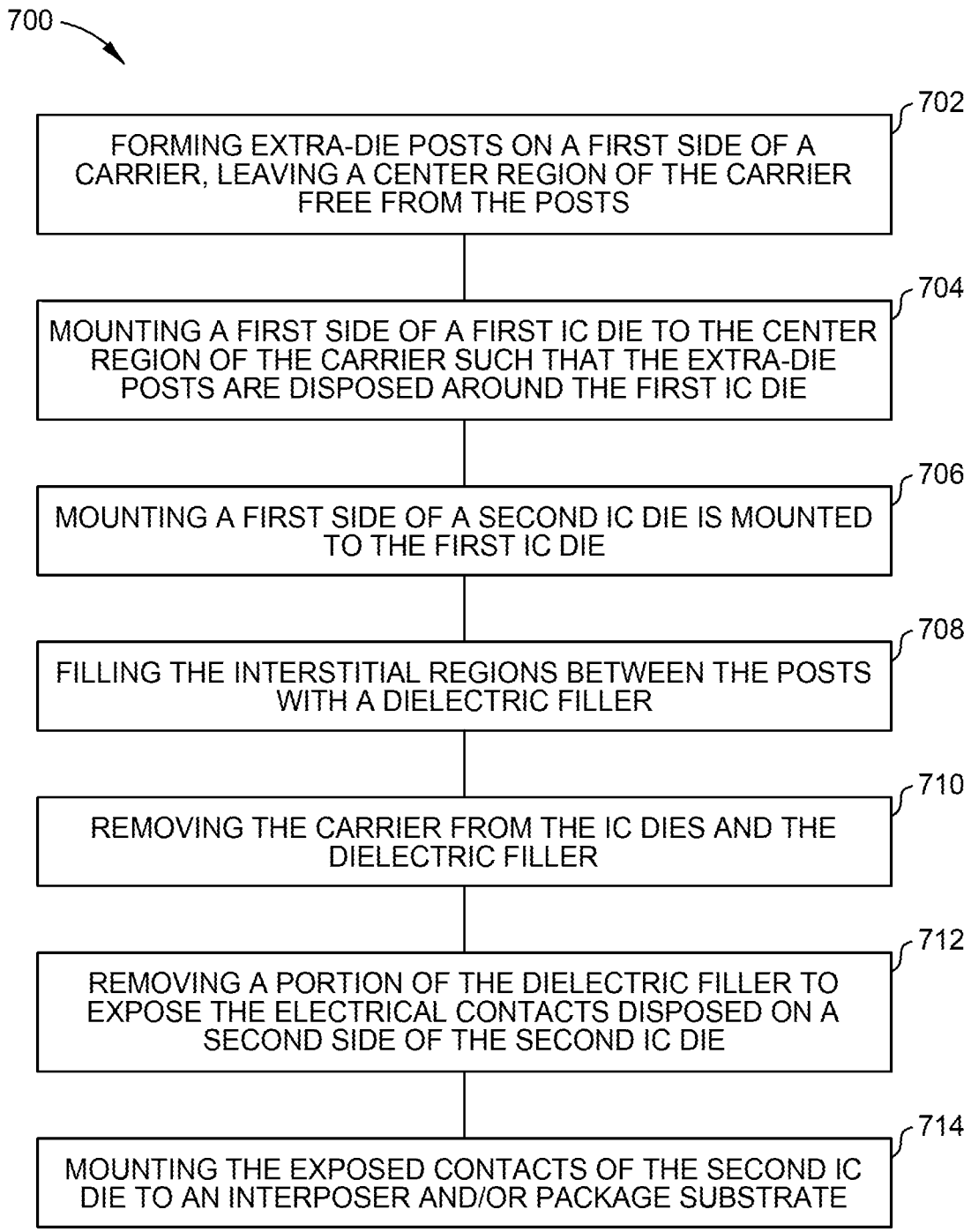

FIG. 7 is a flow diagram of another method 700 for fabricating a chip package assembly, such as but not limited to the chip package assemblies 100, 400 described above. The method 700 begins at operation 702 by forming extra-die posts on a first side of a carrier, leaving a center region of the carrier free from the posts. The extra-die posts are generally formed in an arrangement leaving a center region of the carrier free from the posts. At operation 704, a first side of a first IC die is mounted to the center region of the carrier such that the extra-die posts are disposed around the first IC die.

At operation 706, a first side of a second IC die is mounted to the first IC die. In one example, an active side of the second IC die is mounted to an active side of the first IC die. In another example, the active side of the second IC die is mounted to the substrate side (e.g., silicon side) of the first IC die. At operation 706, solder connections are reflowed between the first and second IC dies, electrically and mechanically connecting the circuitry of first IC die to the circuitry of the second IC die. Also at operation 706, the first side of second IC die is disposed in contact with the posts.

At operation 708, the interstitial regions between the posts are filled with a dielectric filler. As discussed above, the dielectric filler protects the solder connections between adjacent dies. The dielectric filler also increases the structural rigidity of the chip package assembly.

At operation 710, the carrier is removed from the IC dies and the dielectric filler. At operation 712, a portion of the dielectric filler is removed to expose the electrical contacts disposed on a second side of the second IC die. In one example, the dielectric filler is removed to expose the electrical contacts by grinding or other suitable technique. Operation 710 may occur prior to operation 712, or vice versa.

At operation 714, the exposed contacts of the second IC die are mounted to an interposer and/or package substrate. At operation 714, solder connections are reflowed between the second IC die and the interposer, electrically and mechanically connecting the circuitry of second IC die to the circuitry of the interposer.

Thus, a chip package assembly and method for fabricating the same have been provided which utilize a plurality of electrically floating extra-die heat transfer posts extending from the top surface of integrated circuit (IC) dies to improve heat transfer vertically within the chip package assembly. The extra-die heat transfer posts advantageously provide robust conductive heat transfer paths from the upper surfaces of the IC dies. The extra-die heat transfer posts can also be selectively positioned to improve the heat transfer profile across the package assembly. The enhanced heat transfer vertically out of the chip package assembly significantly improves reliability and performance, while also reducing hot spots which could induce warpage or provide insufficient temperature control of the IC dies. Significantly, the ability of the extra-die heat transfer posts to remove heat from middle and bottom dies of vertical die stack significantly reduces thermal coupling and temperature rise within the chip packages assembly, which advantageously improves electromigration (EM) lifetime.

In addition to the claims described below, the technology described above may also be illustrated by one or more of the following non-limiting examples:

Example 1. A chip package assembly comprising:
a substrate having a first surface and an opposing second surface;
a first integrated circuit (IC) die having a first surface and an opposing second surface, the second surface of the first IC die mounted to the first surface of the substrate, the first surface of the first IC die having a recess formed along at least one edge;
a first plurality of electrically floating extra-die conductive posts extending from the first surface of the first IC die; and
a conductive member disposed in the recess.

Example 2. The chip package assembly of example 1, wherein the recess extends along all edges of the first surface of the first IC die.

Example 3. The chip package assembly of example 2, wherein the conductive member has a ring shape and is disposed along all edges of the first surface of the first IC die.

Example 4. The chip package assembly of example 1, wherein at least two or more of the first plurality of extra-die conductive posts are laterally connected by a thermally conductive member.

Example 5. The chip package assembly of example 4, wherein the thermally conductive member comprises:
a metal strip.

Example 6. The chip package assembly of example 1 further comprising:
a cover disposed over the first IC die, the dielectric filler substantially filling a space defined between the cover and the first surface of the first IC die.

Example 7. The chip package assembly of example 6, wherein the cover is in contact with the conductive member.

Example 8. The chip package assembly of example 6 further comprising:
thermal interface material providing a heat transfer path between the cover and the conductive member.

Example 9. A chip package assembly comprising:
a substrate having a first surface and an opposing second surface;
a first integrated circuit (IC) die having a first surface and an opposing second surface, the second surface of the first IC die mounted to the first surface of the substrate;
a first plurality of electrically floating extra-die conductive posts having a first end contacting the first surface of the first IC die and extending to a second end;
a second IC die having a first surface and an opposing second surface, the second surface of the second IC mounted above the first surface of the first IC die between the first plurality of extra-die conductive posts, the first surface of the second IC having a recess along at least one edge;
a second plurality of electrically floating extra-die conductive posts having a first end contacting the first surface of the second IC die and extending to a second end; and
a conductive member disposed in the recess.

Example 10. The chip package assembly of example 9, wherein the recess extends along all edges of the first surface of the second IC die.

Example 11. The chip package assembly of example 10, wherein the conductive member has a ring shape and is disposed along all edges of the first surface of the second IC die.

Example 12. The chip package assembly of example 9, wherein at least two or more of the first plurality of extra-die conductive posts are laterally by a thermally conductive member.

Example 13. The chip package assembly of example 12, wherein the thermally conductive member comprises:
a metal strip.

Example 15. The chip package assembly of example 9 further comprising:
a cover having a surface facing the first surfaces of the first and second IC dies, the second ends of the first and second pluralities of extra-die conductive posts disposed adjacent the surface of the cover, the first and second pluralities of extra-die conductive posts providing a heat transfer path between the cover and the first surfaces of the first and second IC dies.

Example 16. The chip package assembly of example 15, wherein the cover is in contact with the conductive member.

Example 17. The chip package assembly of example 15 further comprising:
thermal interface material providing a heat transfer path between the cover and the conductive member.

Example 18. A method for fabricating a chip package assembly, the method comprising:
mounting a first integrated circuit (IC) die to a substrate, the first IC die having a first plurality of electrically floating extra-die conductive posts extending from a side of the first IC die facing away from the substrate;
mounting a second IC die to the second IC die between the first plurality of extra-die conductive posts extending from the first IC die facing away from the substrate, the first surface of the second IC having a recess along at least one edge; and
disposing a conductive member disposed in the recess.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
a substrate having a first surface and an opposing second surface;
a first integrated circuit (IC) die having a first surface and an opposing second surface, the second surface of the first IC die mounted to the first surface of the substrate; and
a first plurality of electrically floating extra-die conductive posts extending from the first surface of the first IC die, the first plurality of electrically floating extra-die conductive posts not connected to ground power or data.

2. The chip package assembly of claim 1 further comprising:
a dielectric filler disposed between the first plurality of electrically floating extra-die conductive posts.

3. The chip package assembly of claim 2 comprising:
a cover disposed over the first IC die, the dielectric filler substantially filling a space defined between the cover and the first surface of the first IC die.

4. The chip package assembly of claim 1, wherein at least one of the first plurality of electrically floating extra-die conductive posts further comprises:
a heat pipe.

5. The chip package assembly of claim 1, wherein the first plurality of electrically floating extra-die conductive posts each further comprises:
a seed layer disposed on the substrate; and
a bulk thermally conductive layer disposed on the seed layer.

6. The chip package assembly of claim 1 further comprising:
a second IC die having a first surface and an opposing second surface, the second surface of the second IC die mounted above the first surface of the first IC die between the first plurality of electrically floating extra-die conductive posts.

7. The chip package assembly of claim 6 further comprising:
a second plurality of electrically floating extra-die conductive posts extending from the first surface of the second IC die, the second plurality of electrically floating extra-die conductive posts substantially parallel with the first plurality of electrically floating extra-die conductive posts, the second plurality of extra-die conductive posts substantially perpendicular to the first surface of the first IC die.

8. The chip package assembly of claim 7 further comprising:
a dielectric filler disposed between the first plurality of electrically floating extra-die conductive posts and the second plurality of electrically floating extra-die conductive posts.

9. The chip package assembly of claim 8, wherein the first surface of the second IC die further comprises:
a recess formed along at least one edge; and
a conductive member disposed in the recess and connected to one or more of the second plurality of electrically floating extra-die conductive posts.

10. The chip package assembly of claim 1, wherein at least one of the first plurality of electrically floating extra-die conductive posts is comprised of a thermally conductive material selected from a group consisting powder, industrial diamonds, metal wool, discrete metal shapes, solder paste, metal fibers, metal powder, metal particles, metal balls, and thermally conductive adhesive.

11. The chip package assembly of claim 1, wherein at least two or more of the first plurality of electrically floating extra-die conductive posts are laterally connected by a thermally conductive member.

12. The chip package assembly of claim 11, wherein the thermally conductive member comprises:
a metal strip.

13. A chip package assembly comprising:
a substrate having a first surface and an opposing second surface;
a first integrated circuit (IC) die having a first surface and an opposing second surface, the second surface of the first IC die mounted to the first surface of the substrate;
a first plurality of electrically floating extra-die conductive posts having a first end contacting the first surface of the first IC die and extending to a second end, the first plurality of electrically floating extra-die conductive posts not connected to ground power or data;
a second IC die having a first surface and an opposing second surface, the second surface of the second IC die mounted above the first surface of the first IC die between the first plurality of electrically floating extra-die conductive posts;
a second plurality of electrically floating extra-die conductive posts having a first end contacting the first surface of the second IC die and extending to a second end, the second plurality of electrically floating extra-die conductive posts not connected to ground power or data; and a cover having a surface facing the first surfaces of the first and second IC dies, the second ends of the first and second pluralities of electrically floating extra-die conductive posts disposed adjacent the surface of the cover, the first and second pluralities of electrically floating extra-die conductive posts providing a heat transfer path between the cover and the first surfaces of the first and second IC dies.

14. The chip package assembly of claim 13 further comprising:

a dielectric filler disposed between the first and second pluralities of electrically floating extra-die conductive posts, the dielectric filler filling a space defined between the cover and the first surface of the first IC die.

15. The chip package assembly of claim 13, wherein at least one of the first plurality of electrically floating extra-die conductive posts is comprised of a thermally conductive material selected from a group consisting powder, metal wool, discrete metal shapes, industrial diamonds, solder paste, metal fibers, metal powder, metal particles, metal balls, plated metal, and thermally conductive adhesive.

16. The chip package assembly of claim 13, wherein the first surface of the second IC die further comprises:

a recess formed along at least one edge; and a conductive member disposed in the recess and connected to one or more of the second plurality of electrically floating extra-die conductive posts.

17. The chip package assembly of claim 16, wherein at least two or more of the first plurality of electrically floating extra-die conductive posts are laterally connected by a thermally conductive member.

18. The chip package assembly of claim 17, wherein the thermally conductive member comprises:

a metal strip.

19. The chip package assembly of claim 17, wherein at least one or more of the second plurality of electrically floating extra-die conductive posts is laterally connected to at least one of the first plurality of electrically floating extra-die conductive posts by at least one of a thermally conductive material and the conductive member.

20. A method for fabricating a chip package assembly, the method comprising:

mounting a first surface of a first integrated circuit (IC) die to a first surface of a substrate, the substrate having the first surface and an opposing second surface, the first IC die having the first surface and an opposing second surface, the first IC die having a first plurality of electrically floating extra-die conductive posts extending from the opposing second surface of the first IC die facing away from the substrate; and mounting a second IC die to the second IC die between the first plurality of electrically floating extra-die conductive posts extending from the first IC die facing away from the substrate, the first plurality of electrically floating extra-die conductive posts not connected to ground power or data.

* * * * *